(12) United States Patent
Ahn et al.

(10) Patent No.: US 7,030,725 B2
(45) Date of Patent: Apr. 18, 2006

(54) SEMICONDUCTOR DEVICE WITH ELECTRICALLY COUPLED SPIRAL INDUCTORS

(75) Inventors: Kie Y Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/996,364

(22) Filed: Nov. 26, 2004

(65) Prior Publication Data

US 2005/0099260 A1    May 12, 2005

Related U.S. Application Data

(60) Division of application No. 10/644,278, filed on Aug. 19, 2003, which is a continuation of application No. 10/008,900, filed on Dec. 5, 2001, now Pat. No. 6,635,948.

(51) Int. Cl.
*H01F 5/00* (2006.01)

(52) U.S. Cl. ...................................... 336/200

(58) Field of Classification Search ................. 336/65, 336/83, 200, 206–208, 232; 257/531
See application file for complete search history.

(56) References Cited

U.S. PATENT DOCUMENTS

| | | | |
|---|---|---|---|
| 6,025,261 A | 2/2000 | Farrar et al. ............... 438/619 |
| 6,083,802 A | 7/2000 | Wen et al. ............... 438/381 |
| 6,107,893 A | 8/2000 | Forbes ............... 331/132 |
| 6,191,468 B1 | 2/2001 | Forbes et al. ............... 257/531 |
| 6,201,287 B1 | 3/2001 | Forbes ............... 257/528 |
| 6,239,684 B1 | 5/2001 | Farrar et al. ............... 336/200 |
| 6,240,622 B1 | 6/2001 | Ahn et al. ............... 29/604 |
| 6,245,615 B1 | 6/2001 | Noble et al. ............... 438/270 |
| 6,249,191 B1 | 6/2001 | Forbes ............... 331/117 FE |
| 6,251,470 B1 | 6/2001 | Forbes et al. ............... 427/97 |
| 6,277,728 B1 | 8/2001 | Ahn et al. ............... 438/619 |
| 6,287,932 B1 | 9/2001 | Forbes et al. ............... 438/381 |
| 6,414,550 B1 | 7/2002 | Forbes ............... 330/264 |
| 6,420,954 B1 | 7/2002 | Ahn et al. ............... 336/232 |
| 6,492,708 B1 | 12/2002 | Acosta et al. ............... 257/531 |
| 6,535,101 B1 | 3/2003 | Ahn et al. ............... 336/232 |
| 2003/0071325 A1 | 4/2003 | Xu et al. ............... 257/531 |

OTHER PUBLICATIONS

Bassous, E., "Fabrication of Novel Three-Dimensional Microstructures by the Anisotropic Etching of (100) and (110) Silicon," *IEEE Transactions on Electron Devices*, vol. ED-25, No. 10, pp. 1178-1185 (Oct. 1978).

(Continued)

*Primary Examiner*—Tuyen T Nguyen
(74) *Attorney, Agent, or Firm*—Fish & Neave IP Group of Ropes & Gray LLP; Jeffrey H. Ingerman

(57) ABSTRACT

Multiple coupled inductors are formed in a well in a semiconductor device. The inductors, which preferably are spiral inductors, are strongly coupled with high quality factors. The coupled inductors may be used as efficient signal splitting and combining circuits.

7 Claims, 3 Drawing Sheets

OTHER PUBLICATIONS

Brodie, I., et al., *The Physics of Microfabrication*, pp. 1-78 (Plenum Press, New York 1982).

Burghartz, J., et al., "Integrated RF and Microwave Components in BiCMOS Technology," *IEEE Transactions on Electron Devices*, vol. 43, No. 9, pp. 1559-1570 (Sep. 1996).

Burghartz, J., et al., "Multilevel-Spiral Inductors Using VLSI Interconnect Technology," *IEEE Electron Device Letters*, vol. 17, No. 9, pp. 428-430 (Sep. 1996).

Chang, J.Y.-C., et al., "Large Suspended Inductors on Silicon and Their Use in a 2-μm CMOS RF Amplifier," *IEEE Electron Device Letters*, vol. 14, No. 5, pp. 246-248 (May 1993).

Frye, R.C., et al., "Inductive Crosstalk Between Integrated Passive Components in RF-Wireless Modules," *IEEE Proceedings of the 1998 International Conference on Multichip Modules and High Density Packaging*, pp. 496-500 (1998).

Pieters, P., et al., "Spiral Inductors Integrated in MCM-D using the Design Space Concept," *IEEE Proceedings of the 1998 International Conference on Multichip Modules and High Density Packaging*, pp. 478-483 (1998).

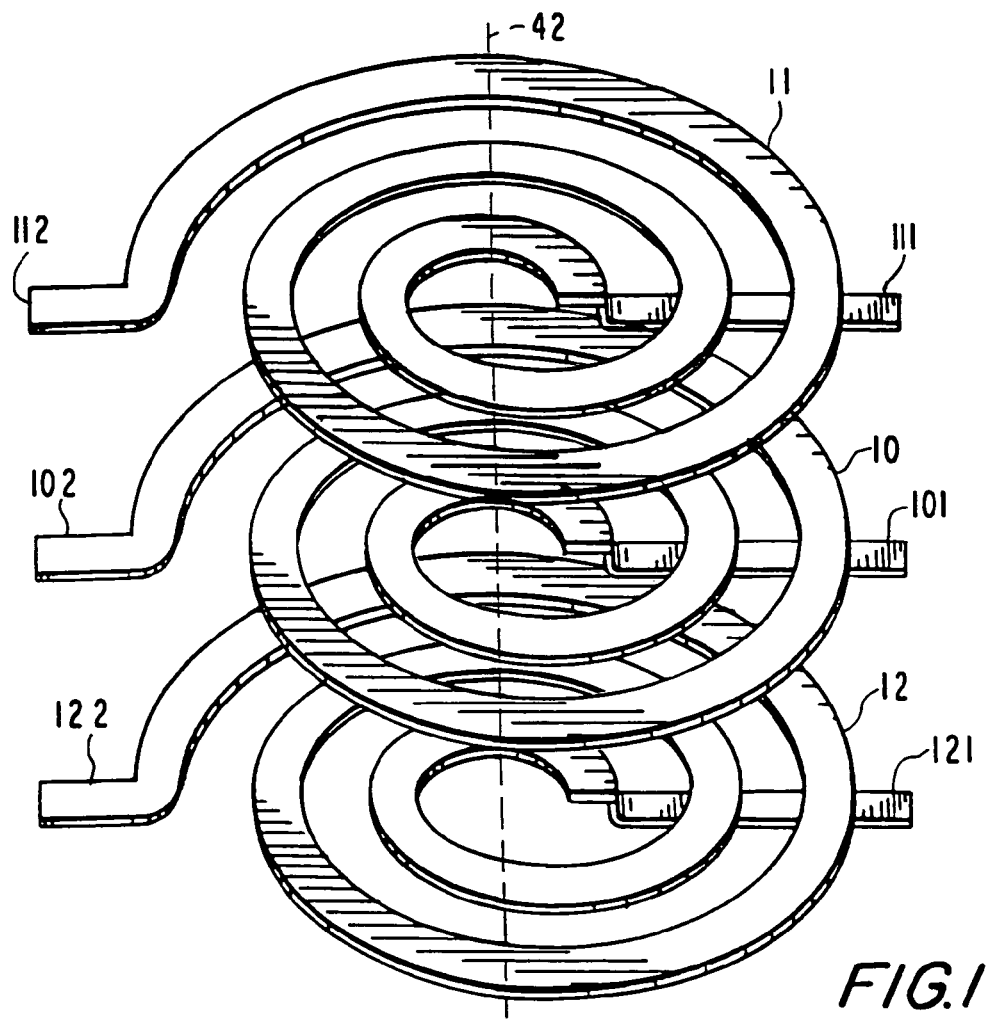
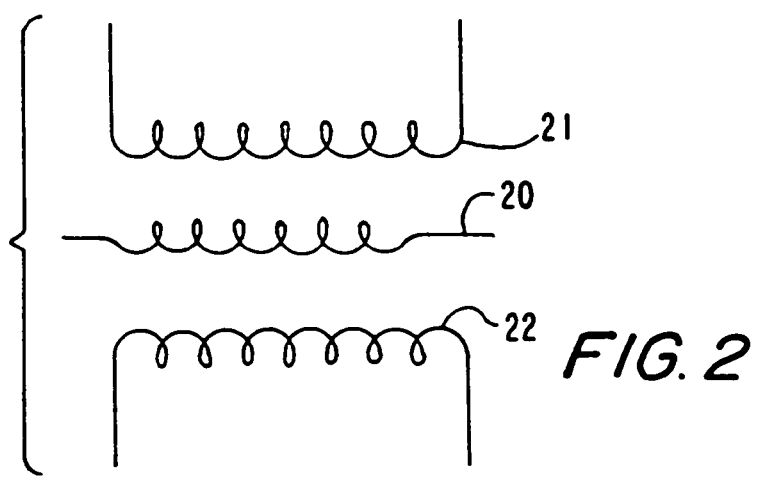

SEMICONDUCTOR DEVICE WITH ELECTRICALLY COUPLED SPIRAL INDUCTORS

CROSS REFERENCE TO RELATED APPLICATION

This is a division of copending, commonly-assigned U.S. patent application Ser. No. 10/644,278, filed Aug. 19, 2003, which is a continuation of U.S. patent application Ser. No. 10/008,900, filed Dec. 5, 2001, now U.S. Pat. No. 6,635,948.

BACKGROUND OF THE INVENTION

This invention relates to an integrated circuit structure having a plurality of inductors arranged so that different pairs of inductors are electrically coupled to one another. More particularly, this invention relates to an integrated circuit structure in which at least three inductors are fabricated adjacent one another in a well in the structure. This invention also relates to power splitters and combiners using such coupled inductors.

It is known that inductors can be formed on the surface of a semiconductor substrate, and that one individual inductor can be coupled to another individual inductor. It is also known that such a coupled pair of inductors can be used as a transformer in, among other things, an RF circuit in which signals must be added or subtracted to perform signal processing and/or modulation/demodulation techniques. However, the coupling coefficient, k, and the quality factor, Q, of such a coupled pair of inductors has been relatively low, and multiple coupled pairs have been required to perform the aforementioned additions and subtractions.

It would be desirable to be able to provide, on semiconductor devices, coupled inductors with high s coupling coefficients and quality factors. It would further be desirable to be able to provide a way to efficiently add or subtract RF or other time-varying signals in a semiconductor circuit.

SUMMARY OF THE INVENTION

In accordance with the present invention, three or more spiral inductors are formed in a well on a semiconductor substrate. Preferably, the inductors are aligned one above the other, most preferably with a common central axis. This arrangement provides coupling coefficients, between adjacent inductors, which may be as high as 0.8 or 0.9. Although there is some coupling between all pairs of inductors, non-adjacent inductors may be considered to effectively be shielded from one another by any intervening inductors, and therefore that coupling can be ignored as, at most, a second-order effect.

In the preferred three-inductor case, if two time-varying current signals such as RF signals (or any other non-steady-state signals) are input into the two outer inductors, a time-varying voltage signal will be output on the center inductor that is proportional to the sum or difference, depending on the relative polarities (this is actually a case of signed addition), of those two signals. This assumes the same number of turns in each spiral inductor. If the number of turns is varied, a signal proportional to a sum (or difference) of multiples (or fractions) of those two signals may be obtained. Either way, the output current will be a function of the output load.

Similarly, in the preferred three-inductor case, if a time-varying current signal such as an RF signal (or any other non-steady-state signal) is input into the center inductor, the output signal will be split between the two outer inductors. Assuming the same number of turns in each spiral inductor, the voltage waveform of each output signal will be the same, while the currents in the two output signals will be functions of the output loads. If the number of turns is varied, each of the output voltage signals on the outer inductors will be proportional to a multiple (or fraction) of the input signal current. The output currents will depend on the output loads.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 1 is a diagrammatic perspective view of three spiral inductors arranged in accordance with the present invention;

FIG. 2 is an electrically equivalent schematic representation of the three inductors of FIG. 1;

DETAILED DESCRIPTION OF THE INVENTION

Figure 3:
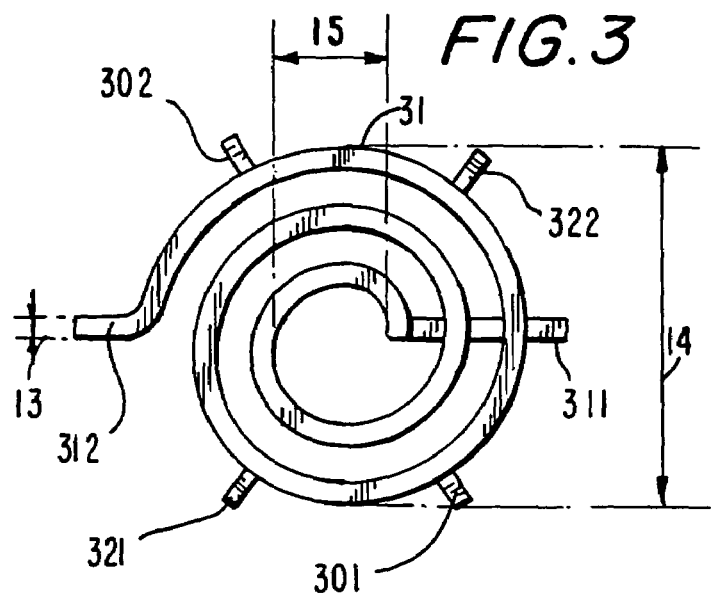
FIG. 3 is a plan view of the three inductors of FIG. 1 in a well on a semiconductor chip.

At this point, it useful to note that the time-varying voltage induced in an inductor having inductance $L_2$ by a time-varying current $i_1(t)$ flowing in another inductor to which it is coupled, the other inductor having inductance $L_1$, is $V_2(t)=m(di_1/dt)$, where $m=k(L_1L_2)^{0.5}$, k being the coupling coefficient.

For example, it is well known that the time-varying voltage in inductor $L_1$ is $V_1(t)=L_1(di_1/dt)$. Therefore, $(di_1/dt)=V_1(t)/L_1$. It follows that:

$$V_2(t) = mV_1(t)/L_1$$
$$= (k(L_1L_2)^{0.5}/L_1)V_1(t)$$
$$= V_1(t)k(L_2/L_1)^{0.5}.$$

For an ideal transformer, where k=1:

$$V_2(t)=V_1(t)(L_2/L_1)^{0.5}, \text{ or}$$

$$V_2(t)/V_1(t)=(L_2/L_1)^{0.5}.$$

Because $L_n \propto N_n^2$, $V_2(t)/V_1(t) \propto (N_2/N_1)$, which is the familiar relation for an ideal transformer. However, the actual induced voltage $V_2(t)$ in the second inductor is a function not of the voltage $V_1(t)$ applied to the first inductor, but of the current $i_1(t)$ flowing in the first inductor, and of the coupling coefficient, k, as set forth above.

As described above, in accordance with the present invention, three or more inductors—preferably three inductors—are formed in a well in the substrate of a semiconductor device. Because the inductors are formed with the proximity needed to fit within the well, the coupling coefficient, k, and quality factor, Q, for each pair of adjacent inductors is very high. Preferably, the inductors are spiral inductors, and more preferably they are aligned parallel to one another, and with their respective centers aligned along a single axis. For such inductors, the coupling coefficient, k, would be between about 0.8 and about 0.9, and a quality factor, Q, of between about 10 and about 50 can easily be achieved.

Although there is also coupling between non-adjacent inductors—e.g., between the top and bottom inductors in the three-inductor stack described above—the coupling coefficients are much lower and may considered as, at most, only second-order effects; effectively, they may be ignored. Thus, if each inductor has a pair of input/output terminals, any time-varying—i.e., non-steady state—signal input on those terminals will be coupled to the neighboring inductor or inductors. For example, in the three-inductor case, a signal input on the center inductor will be coupled to each of the outer inductors, while a signal input on one of the outer inductors will be coupled to the center inductor. While there is some coupling of a signal applied to one of the outer inductors to the other outer inductor, the coupling coefficient is so low that for substantially all practical purposes, it may be ignored.

As set forth above, an exemplary use of a three-inductor arrangement as described herein is as a signal splitter and/or combiner. The simplest case is that of a signal splitter in which all of the inductors have the same number of turns. In such a case, if a time-varying current waveform is applied to the center inductor, identical output voltage signals will be induced in each of the outer inductors. Each of those output signals will have the same time-varying voltage amplitude. The output current signals will depend on the loads to which the voltage signals are applied.

The situation is somewhat more complex in a signal splitter in which the number of turns is not the same in all of the inductors. If the two outer inductors have the same number of turns $n_o$ and the center inductor has a number of turns $n_c$, each of the output signals will have the same time-varying voltage amplitude as each other, which will be proportional to $n_o/n_c$ times the current amplitude of the input signal (this can be a fraction or a multiple depending on the relative values of $n_o$ and $n_c$). As above, the distribution of the total current between the two output signals will depend on the loads to which the signals are applied.

If the two outer inductors have two different numbers of turns $n_1$ and $n_2$ and the center inductor has a number of turns $n_c$, then one output signal will have a time-varying voltage amplitude which will be proportional to $n_1/n_c$ times the current amplitude of the input signal (this can be a fraction or a multiple depending on the relative values of $n_1$ and $n_c$), and the other output signal will have a time-varying voltage amplitude which will be proportional to $n_2/n_c$ times the current amplitude of the input signal (this can be a fraction or a multiple depending on the relative values of $n_2$ and $n_c$). Once again, the distribution of the total current between the two output signals will depend on the loads to which the signals are applied.

In the case of a signal combiner, the output signal on the center inductor is a superposition of signals induced separately by the two outer inductors. The simplest case again is that in which all three inductors have the same number of turns. In such a case, if the two input signals on the respective outer inductors have the same current, the combined signal output from the center inductor will have a voltage that depends on the sum of the two input currents. If the two outer inductors have the same number of turns $n_o$ and the center inductor has a number of turns $n_c$, and the two input signals on the respective outer inductors have the same current, then the voltage amplitude of the output signal on the center inductor will be proportional to $n_c/n_o$ times that current (this can be a fraction or a multiple depending on the relative values of $n_o$ and $n_c$). The current in the output signal will depend on the output load.

If in the foregoing cases the two input signals have different currents, or if the two outer inductors have two different numbers of turns $n_1$ and $n_2$ (even if the two input currents are the same) and the center inductor has a number of turns $n_c$, then the output signal on the center inductor will have time-varying voltage and current amplitudes which can be determined using the concepts set forth above.

The preferred physical arrangement of the three inductors 10, 11, 12 is shown in FIG. 1. In the arrangement shown, each inductor 10, 11, 12 is a spiral inductor having 2.5 turns, but other numbers of turns can be provided, and it is not necessary for all inductors 10, 11, 12 to have the same number of turns, as discussed above. Each inductor 10, 11, 12 has a central terminal 101, 111, 121 and an outer terminal 102, 112, 122. It will be appreciated that the schematic electrical equivalent of this arrangement is that shown in FIG. 2, where inductors 20, 21, 22 correspond, respectively, to inductors 10, 11, 12.

Figure 4:
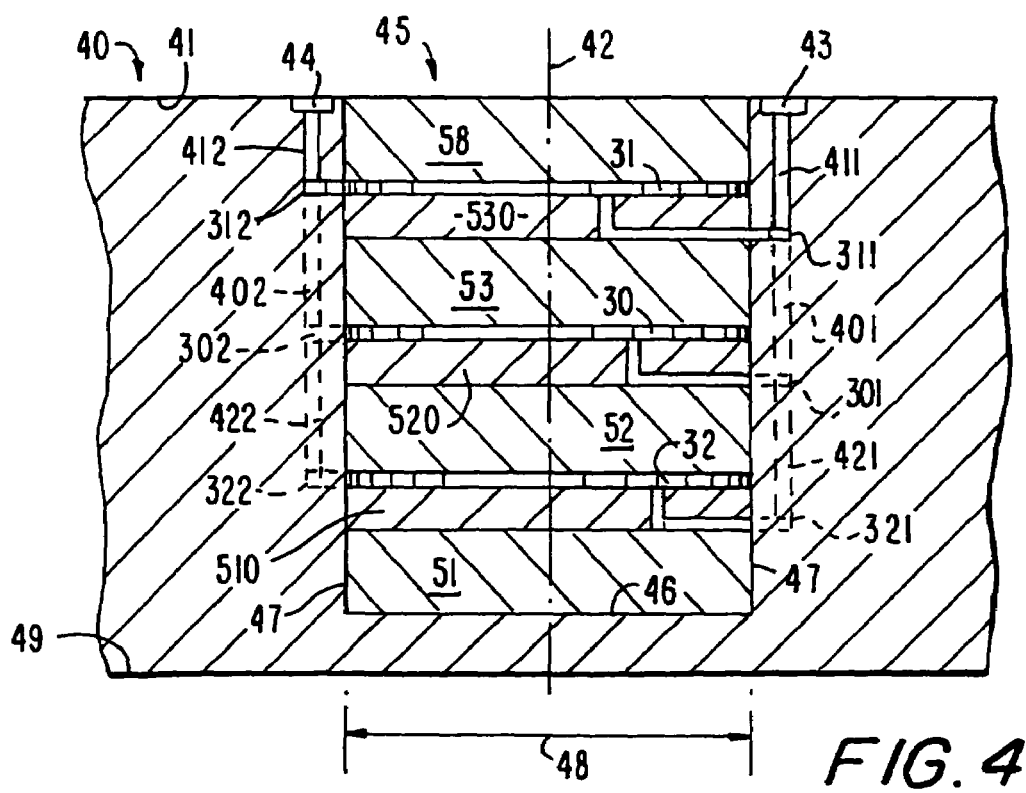
FIG. 4 is a cross-sectional view of the inductors of FIG. 3.

The physical layout of inductors 10, 11, 12 on a semiconductor device 40 is shown in FIGS. 3 and 4. As shown, each of inductors 10, 11, 12 includes 2.5 turns and all are of the same dimensions, so that it in the plan view of FIG. 3, only the uppermost inductor 31 is visible, except for the terminals 301, 302, 321, 322 of the center and lower inductors 30, 32, which are visible because in this view inductors 30, 31, 32 are angularly offset about their common axis. As shown, the offset is 120°, although any offset sufficient to separate the terminals one from the other, so that they can be brought separately to the surface 41 of device 40 without touching one another, can be used. A zero or other small offset can also be used, but would require the provision of more complex conduction paths to the surface to avoid having the conduction paths touch one another.

In the embodiment shown, each of inductors 30, 31, 32 is substantially parallel to surface 40, and the center-points of the inductors 30, 31, 32 are aligned along an axis 42 perpendicular to surface 41, forming the "common axis" referred to above. Inductors 30, 31, 32 also could be arranged so that one or more are slightly off-axis with respect to the others, in which case, in a view (not shown) similar to FIG. 3, portions of one or both of inductors 30, 32 would be visible. However, in such a case the coupling coefficients would be lower.

As seen in FIG. 4, each of the central terminals 301, 311, 321, preferably extends downward a short distance below the plane of its respective inductor 30, 31, 32, before preferably extending laterally beyond the outer edge of the turns of the respective inductor. Each central terminal 301, 311, 321 preferably is connected by a respective conductor 401, 411, 421 substantially perpendicularly to the planes of inductors 30, 31, 32 to contact pads on the surface 41 of device 40. One contact pad 43, connected to central terminal 311 of upper inductor 31 is shown. The remaining contact pads for terminals 301, 321 are "behind" pad 43 in the view of FIG. 4, just as "vertical" conductors 401, 411, 421 appear "behind" one another in that view, while in fact in this embodiment they are separated by 120° about axis 42. Similarly, each of outer terminals 302, 312, 322 extends laterally in the plane of its respective inductor 30, 31, 32 and is brought to surface 41 by a respective one of "vertical" conductors 402, 412, 422, to respective pads on surface 41 of which pad 44, connected to terminal 312, is visible in FIG. 4.

Because each of inductors 30, 31, 32 in the embodiment shown has an odd number of half-turns (i.e., 2.5 turns, or five half-turns), the paired central and outer terminals for each respective inductor are 180° apart, which allows easy illustration in FIG. 4. However, the inductors may have any numbers of turns, and may not even have the same numbers of turns. Moreover, each terminal may be brought to a surface contact pad via any path that is convenient in the context of the particular circuitry of device 40. Indeed, rather than being brought to a contact pad, any one or more of terminals 301, 302, 311, 312, 321, 322 can be connected directly to other circuitry on device 40.

Figure 5:
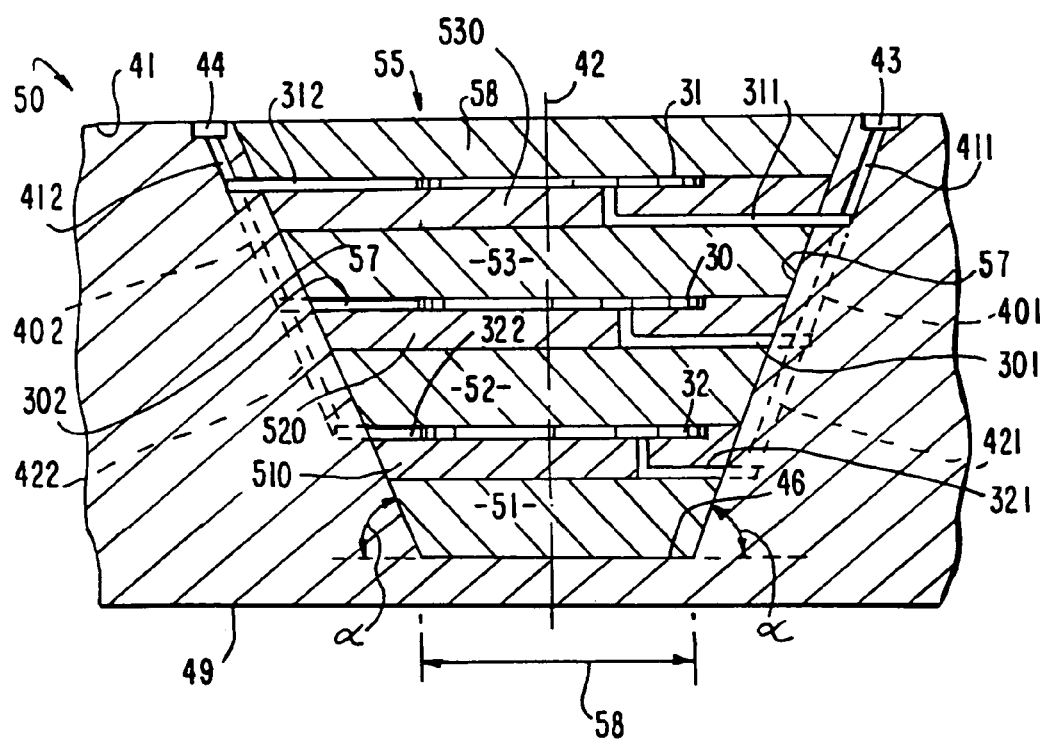
FIG. 5 is a cross-sectional view, similar to FIG. 4, of an alternative embodiment of the invention.

As can be seen, well 45 preferably has a substantially flat "bottom" 46—i.e., bottom 46 preferably is substantially parallel to surface 41 of device 40. Well 45 preferably also has walls 47 that preferably are substantially perpendicular to surface 41 and to bottom 46. Alternatively, as can be seen in device 50 of FIG. 5, wall 57 of well 55 may be at an oblique angle relative to surface 41 and to bottom 46. In the particular embodiment shown in FIG. 5, walls 57 are at an angle, α, of about 54.74° relative to surface 41 and to bottom 46, corresponding to the termination of the etch of the well along a specific (111) crystal plane. Preferably, the diameter 48 of well 45 is about 2000 μm, while the diameter 58 preferably measured at the bottom of well 55 preferably also is about 2000 μm. In either case, the depth of well 45, 55 preferably is about 500 μm. Each inductor 30, 31, 32 preferably has 2.5 turns, with a preferred conductor width 13 (FIG. 3) of about 100 μm, a preferred outer diameter 14 (FIG. 3) of about 1200 μm, a preferred inner diameter 15 (FIG. 3) of about 480 μm, and an inductance of about 7.1 nH. Bottom inductor 32 preferably is at least about 300 μm from ground plane 49, and about 100 μm from bottom 46.

Well 45, 55 preferably is formed using standard etching or trenching techniques used to form trenches and vias in semiconductor devices. After well 45, 55 has been formed, a first insulating or dielectric layer 51 preferably is formed, preferably about 100 μm in thickness, and preferably of an oxide as is typically used for such purposes. Next, the lead-in 321 for inductor 32 preferably is formed, preferably by electroplating, but possibly by deposition, and preferably terminated to surface 41. Next, another insulating or dielectric layer 510 having a thickness between about 30 μm and about 50 μm preferably is formed above lead-in 321, and then inductor 32 itself is preferably formed, again preferably by electroplating, and then lead-in 322 preferably is formed and terminated to surface 41. A further insulating or dielectric layer 52 is preferably formed above inductor 32, preferably having a thickness such that the top of layer 52 is about 40% of the well depth above bottom 46. Next, the lead-in 301 for inductor 30 preferably is formed, preferably by electroplating, and preferably terminated to surface 41. Next, another insulating or dielectric layer 520 having a thickness between about 30 μm and about 50 μm preferably is formed above lead-in 301, and then inductor 30 itself is preferably formed, again preferably by electroplating, and then lead-in 302 preferably is formed and terminated to surface 41. A further insulating or dielectric layer 53 is preferably formed above inductor 30, preferably having a thickness of about 100 μm. Next, the lead-in 311 for inductor 31 preferably is formed, preferably by electroplating, and preferably terminated to surface 41. Next, another insulating or dielectric layer 530 having a thickness between about 30 μm and about 50 μm preferably is formed above lead-in 311, and then inductor 31 itself is preferably formed, again preferably by electroplating, and then lead-in 312 preferably is formed and terminated to surface 41. A further insulating or dielectric layer 58 is preferably formed above inductor 31, preferably having a thickness such that the top of layer 58 is substantially flush with surface 41.

The finished coupled inductor structure can be used for any purpose for which inductors are required, including for splitting and combining signals as described above. In addition, any one of inductors 30, 31, 32 can be used singly, where coupled inductors are not required, but in that case the other inductors cannot be used because the signals on those inductors would be expected to couple to the first inductor.

Thus it is seen that coupled inductors with high coupling coefficients and quality factors can be provided on semiconductor devices, and can be used to efficiently add or subtract RF or other time-varying signals in a semiconductor circuit, among other uses. One skilled in the art will appreciate that the present invention can be practiced by other than the described embodiments, which are presented for purposes of illustration and not of limitation, and the present invention is limited only by the claims which follow.

What is claimed is:

1. A semiconductor signal splitter comprising:
   a first spiral conductor fabricated substantially in a first horizontal plane;
   a second spiral conductor fabricated substantially in a second horizontal plane above the first plane; and
   a third spiral conductor fabricated substantially in a third horizontal plane above the second plane, wherein the first, second and third spiral conductors are axially aligned, such that the first and second spiral conductors are positioned to be inductively coupled during operation, and the second and third spiral conductors are positioned to be inductively coupled during operation; whereby:
   when a signal is applied to said second spiral conductor, a first portion of said signal is output on said first spiral conductor and a second portion of said signal is output on said third spiral conductor.

2. The semiconductor signal splitter of claim 1 wherein:
   the first spiral conductor comprises $n_1$ turns;
   the second spiral conductor comprises $n_2$ turns;
   the third spiral conductor comprises $n_3$ turns;
   a time-varying current waveform with amplitude (I) applied to the second spiral conductor produces an time-varying voltage output waveform from the first spiral conductor having an amplitude proportional to $(n_1/n_2)I$, and a time-varying voltage output waveform from the third spiral conductor having an amplitude proportional to $(n_3/n_2)I$.

3. The semiconductor signal splitter of claim 1 wherein the first, second and third spiral conductors are located within a semiconductor substrate well.

4. The semiconductor signal splitter of claim 3 wherein:
   said spiral conductors are fabricated in a semiconductor substrate having a major surface defining a plane; and
   said well is formed in said major surface.

5. The semiconductor signal splitter of claim 4 wherein said well comprises:
   a bottom surface substantially parallel to said plane; and
   a side wall substantially perpendicular to said plane.

6. The semiconductor signal splitter of claim 4 wherein said well comprises:
   a bottom surface substantially parallel to said plane; and
   a side wall at an oblique angle relative to said plane.

7. The semiconductor signal splitter of claim 6 wherein said side wall is at an angle of about 54.74° relative to said plane.

* * * * *

UNITED STATES PATENT AND TRADEMARK OFFICE
CERTIFICATE OF CORRECTION

PATENT NO. : 7,030,725 B2 Page 1 of 1
APPLICATION NO. : 10/996364
DATED : April 18, 2006
INVENTOR(S) : Kie Y. Ahn et al.

It is certified that error appears in the above-identified patent and that said Letters Patent is hereby corrected as shown below:

Column 1, line 35, "high s coupling" should be -- high coupling --.

Column 2, line 31, after "it" should be inserted -- is --.

Column 3, line 7, after "may" should be inserted -- be --.

Column 4, line 24, "it" should be deleted.

Signed and Sealed this

Nineteenth Day of September, 2006

JON W. DUDAS
*Director of the United States Patent and Trademark Office*